(12) United States Patent
Kalburge et al.

(10) Patent No.: US 7,816,906 B2
(45) Date of Patent: Oct. 19, 2010

(54) METHOD FOR DETERMINING ANISOTROPY OF 1-D CONDUCTOR OR SEMICONDUCTOR SYNTHESIS

(75) Inventors: Amol M. Kalburge, Irvine, CA (US); Zhen Yu, Irvine, CA (US)

(73) Assignee: RF Nano Corporation, Newport Beach, CA (US)

( * ) Notice: Subject to any disclaimer, the term of this patent is extended or adjusted under 35 U.S.C. 154(b) by 297 days.

(21) Appl. No.: 12/060,777

(22) Filed: Apr. 1, 2008

(65) Prior Publication Data

US 2009/0058395 A1 Mar. 5, 2009

(51) Int. Cl.
*G01R 31/28* (2006.01)
(52) U.S. Cl. ........................................ 324/158.1; 716/4
(58) Field of Classification Search ................. 977/762; 257/24; 324/765, 158.1, 754; 716/4
See application file for complete search history.

(56) References Cited

U.S. PATENT DOCUMENTS

| | | | | |
|---|---|---|---|---|
| 5,049,347 A * | 9/1991 | Magill et al. | ................ | 264/280 |
| 5,576,833 A * | 11/1996 | Miyoshi et al. | ............ | 356/394 |
| 6,252,412 B1 * | 6/2001 | Talbot et al. | ................ | 324/750 |
| 6,764,628 B2 * | 7/2004 | Lobovsky et al. | ...... | 264/172.15 |
| 6,822,724 B2 * | 11/2004 | Ogishima et al. | ........... | 349/181 |
| 7,067,328 B2 * | 6/2006 | Dubrow et al. | ................. | 438/1 |
| 7,135,728 B2 * | 11/2006 | Duan et al. | ................. | 257/296 |
| 7,442,926 B2 * | 10/2008 | Han et al. | .................... | 250/307 |
| 2008/0023693 A1 * | 1/2008 | Dubrow et al. | ................ | 257/24 |

* cited by examiner

*Primary Examiner*—Ha Tran T Nguyen
*Assistant Examiner*—Richard Isla Rodas
(74) *Attorney, Agent, or Firm*—Greenberg Traurig LLP; Bradley D. Blanche

(57) ABSTRACT

A method is provided for determining the anisotropy of alignment of a random array of 1-D conductive elements (e.g., carbon nanotube or silicon nanowire) formed on a substrate. A pattern of a plurality of electrodes are arranged on the substrate containing the 1-D conductive elements and a plurality of electrical property measurements are performed in a plurality of different directions between the plurality of electrodes. The plurality of measurements are combined together to generate a total measurement sum of electrical property measurements between the various electrodes. The measured electrical property is determined between a selected pair of the plurality of electrodes along a selected direction extending between the selected pair of electrodes. The anisotropy of alignment of the 1-D conductive elements on the substrate along the selected direction is determined based on a ratio of the measured electrical property between the selected pair of electrodes versus the total measurement sum.

20 Claims, 4 Drawing Sheets

METHOD FOR DETERMINING ANISOTROPY OF 1-D CONDUCTOR OR SEMICONDUCTOR SYNTHESIS

TECHNICAL FIELD

This disclosure relates generally to the orientation of 1-D conductors or semiconductors and, more particularly, to a method for accurately and rapidly characterizing the anisotropy of the alignment of 1-D conductors or semiconductors.

BACKGROUND

One of the challenges of characterizing any random orientation of 1-D conductors or semiconductors is measuring the anisotropy in alignment in a specified direction. One commonly used approach to determine such alignment of 1-D conductors or semiconductors has been to use physical characterization techniques, such as, scanning electron microscopy (SEM) or atomic force microscopy (AFM) to determine alignment. One of the drawbacks of such an approach, using SEM or AFM, is that it is an extremely slow and tedious process due to manual nature of image acquisition and image processing to count the number of 1-D semiconductors or conductors along given orientation. Such an approach can also lead to inaccuracies in measurement.

Another approach to determine alignment of 1-D conductors or semiconductors has involved the use of Raman spectroscopy. This approach uses the intensity of a characteristic radial breathing mode (RBM) for a given orientation of a substrate with respect to the polarization of the exciting beam of light. The Raman spectroscopy approach is also extremely slow, especially with 1-D conductors, because it requires either rotating the substrate or polarization of exciting light to acquire RBM intensity along a given direction. Low intensity of light scattered from 1-D conductors, which inherently have low capture-cross section, will force the user to use longer integration times which can also slow down this approach significantly.

SUMMARY

According to a feature of the disclosure, a method is provided for accurately and rapidly characterizing the anisotropy of the alignment of 1-D conductors or semiconductors. The accurate and rapid anisotropic alignment characterization provides information that can be used to optimize such anisotropic alignment in a pre-determined direction.

In one or more embodiments, a method is provided for characterizing the anisotropy of the alignment of 1-D conductive elements formed on a substrate. A plurality of electrodes arranged in pre-determined pattern or shape are arranged on the substrate containing 1-D conductive elements. A plurality of measurements of an electrical property (e.g., current) are performed in a plurality of different desired directions between the plurality of electrodes. The plurality of measurements are combined together to generate a total measurement sum of electrical property measurements between the various electrodes. The measured electrical property is determined between a selected pair of the plurality of electrodes along a selected direction extending between the selected pair of electrodes. The anisotropy of the alignment of the 1-D conductive elements on the substrate along the selected direction is determined based on a ratio of the measured electrical property between the selected pair of electrodes versus the total measurement sum.

In one or more embodiments, a method is provided for determining the anisotropy of the alignment of 1-D conductive elements on a substrate having a random, unknown array or orientation of 1-D conductive elements. A pre-determined shape or pattern of multiple electrically isolated electrodes are formed on the 1-D conductor elements. The fraction of 1-D conductive elements aligned in a specified direction (i.e., anisotropy) is determined by measuring an electrical property along such direction between two electrodes and dividing the measured electrical property by the sum of magnitudes of the same electrical property measured between independent pairs of electrodes in all of the other directions.

The method can be implemented for substrates either before or after synthesis of a network of 1-D conductors or semiconductors. In one or more embodiments, the 1-D conductors or semiconductors comprise a carbon nanotube or silicon nanowire. In one or more embodiments, the electrical property measured between respective pairs of electrodes is an electrical current. In such embodiments, electrical current is measured between all independent pairs of electrodes, such as by applying an appropriate voltage, thereby yielding several currents, $I_{i,j}$, where i and j are two electrodes in a pair and wherein i and j each range between 1 and the number of plurality of electrodes positioned on the substrate. The anisotropy of the alignment of the 1-D conductors or semiconductors can be measured by determining the fraction of 1-D conductors or semiconductors aligned in certain directions. For instance, the fraction of 1-D conductors or semiconductors aligned along a direction between a selected pair of electrodes (e.g., electrodes 1 and 2) is determined according to the following equation:

$$\text{Anisotropy} = \frac{I_{12}}{\sum_{i,j}^{i \neq j} I_{i,j}}$$

In one or more embodiments, several electrode patterns can be deposited across a whole area of interest (e.g., an entire wafer), and such measurements can be repeated to generate a combined map of the "entity anisotropy." Automated test equipment (ATE) connected to electrodes so as to measure the electrical properties can be pre-programmed to accurately acquire these measurements in negligible amount of time. In one aspect, such an entity anisotropy can be used to optimize synthesis parameters to maximize or minimize anisotropy in a given direction.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

The present disclosure is directed to a method for accurately and rapidly characterizing the anisotropy of the alignment of 1-D conductors or semiconductors. In the following description, numerous embodiments are set forth in order to provide a thorough understanding of the invention. It will be apparent, however, to one skilled in the art, that these and other embodiments may be practiced without these specific details. In other instances, well-known features have not been described in detail in order not to obscure the invention.

Figure 1:
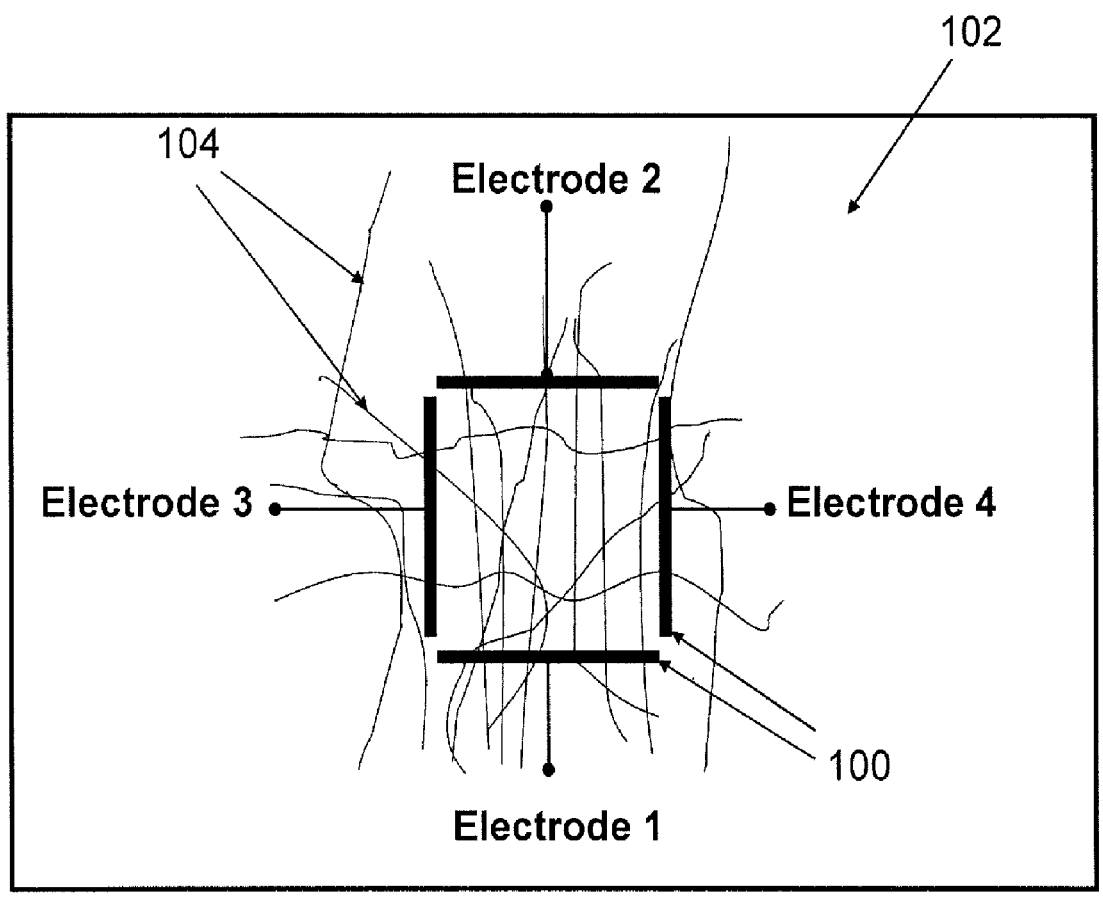
FIG. 1 is an illustration of a geometry of electrically isolated electrodes deposited on a surface of a random network of 1-D conductors or semiconductors in accordance with one embodiment of the present disclosure.

Referring now to FIG. 1, an illustration of a geometry of electrically isolated electrodes 100 deposited on a surface of a substrate 102 containing a random network of 1-D conductive elements 104 is provided in accordance with one or more embodiments of the present disclosure. The 1-D conductive elements 104 may comprise any 1-D conductors or semiconductors, such as but not limited to carbon nanotubes or silicon nanowires. An appropriate geometry pattern of electrically isolated electrodes 100 are formed on the surface of substrate 102 in a conductive relationship with the 1-D conductive elements 104. The electrodes 100 can be arranged on the substrate 102 either after synthesis of network of 1-D conductive elements 104 or before such synthesis. In accordance with one or more embodiments, the method described herein is implemented for a substrate 102 after synthesis of an unknown, random array or network of 1-D conductive elements 104 on the substrate 102 in order to identify the anisotropy of the alignment of the 1-D conductive elements 104 on the substrate 102.

In the representative example illustrated in FIG. 1, four line electrodes 100 are deposited substantially in the shape of a square over a portion of the substrate 102. However, it is understood that other electrode patterns, configurations or geometries can also be utilized containing any number of a plurality of electrodes 100 in the various embodiments described herein. In one or more embodiments, the electrodes 100 can be deposited on substrate 102 by any deposition techniques, including, but not limited to, standard lithographic techniques, any other direct-write methodology, direct stamping methodologies, or any other deposition/patterning process.

Anisotropy as described herein refers to the fraction of 1-D conductive elements 104 aligned in a specified direction on the substrate 102. Referring now to the operational flow diagram of FIG. 2, in accordance with one or more embodiments, a method is provided for characterizing the anisotropy of the alignment of 1-D conductive elements 104 formed on the substrate 102. A plurality of electrodes 100 having a pre-determined pattern or shape are arranged on the substrate 102 containing 1-D conductive elements 104 in step 200. A plurality of measurements of an electrical property (e.g., electrical current) are performed in step 202 in a plurality of different desired directions between independent pairs of electrodes 100. The plurality of measurements are combined together to generate a total measurement sum of measurements between each of the independent pairs of electrodes. In one or more embodiments, the plurality of different desired directions will comprise all possible directions between independent pairs of electrodes 100, while it is understood that smaller subsets of directions can be selected to generate an appropriate total sum of measurements in certain circumstances. In step 204, the measured electrical property between a selected pair of the plurality of electrodes 100 along a selected direction extending between the selected pair of electrodes 100 is determined. The measured electrical property between the selected pair of electrodes can either be obtained from the measurement taken when calculating the total measurement sum or may be separately measured. The measured electrical property for the selected pair of electrodes 100 is then divided by the total measurement sum in step 206 to generate a fraction or ratio associated with the selected pair of electrodes 100 with respect to the total measurement sum. In step 208, the anisotropy of alignment of the 1-D conductive elements 104 on the substrate 102 along the selected direction between the selected pair of electrodes 100 is determined based on the generated fraction or ratio of the measured electrical property for the selected pair of electrodes 100 versus the total measurement sum.

Figure 3:
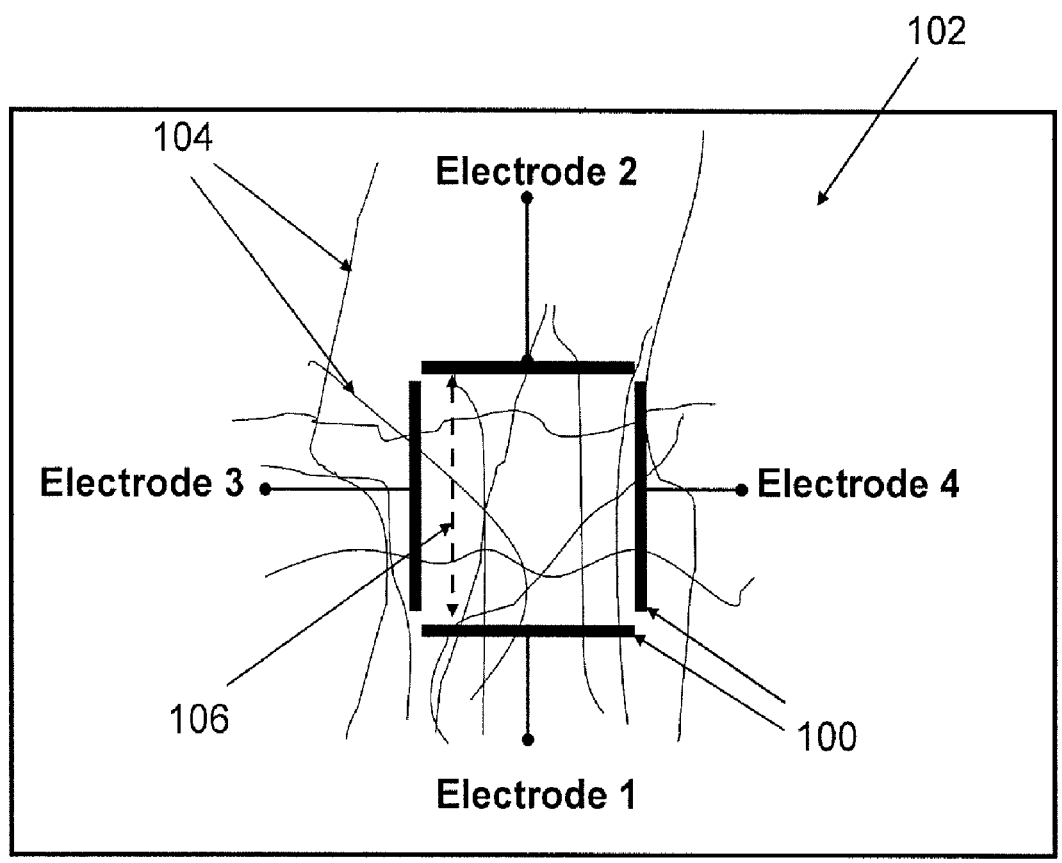
FIG. 3 is an illustration of a geometry of electrically isolated electrodes deposited on a surface of a random network of 1-D conductors or semiconductors in accordance with one embodiment of the present disclosure.

In one or more embodiments, the electrical property measured between respective pairs of electrodes 100 is an electrical current. In such embodiments, electrical current is measured between all independent pairs of electrodes 100, such as by applying an appropriate voltage, thereby yielding several currents, $I_{i,j}$, where i and j are two electrodes 100 in a selected pair for a selected direction, wherein i and j each range between 1 and the number of plurality of electrodes 100 positioned on the substrate 102. For example, for the specific embodiment of a geometry of four electrically isolated electrodes 100 deposited on a surface of a substrate 102 containing a random network of 1-D conductive elements 104 illustrated in FIG. 3, i and j each range between 1 and 4 ($1 \leq i, j \leq 4$). The anisotropy of the alignment of the 1-D conductive elements 104 is determined according the any of the various embodiments described herein by determining the fraction of 1-D conductive elements 104 aligned in certain directions. For instance, the fraction of 1-D conductive elements 104 aligned along a direction 106 between a selected pair of electrodes (electrodes 1 and 2) is determined by comparing a measured current between electrodes 1 and 2 ($I_{1,2}$) against the combined total measurement sum $$\left( \sum_{i,j}^{i \neq j} I_{i,j} \right)$$

of all the currents measured between all independent pairs of electrodes 100 according to the following equation:

$$\text{Anisotropy} = \frac{I_{12}}{\sum_{i,j}^{i \neq j} I_{i,j}}$$

Based on the above fraction or ratio, the fraction of the measured current ($I_{1,2}$) between electrodes 1 and 2 against the combined total measurement sum $$\left( \sum_{i,j}^{i \neq j} I_{i,j} \right)$$

will provide an indication of the percentage of 1-D conductive elements 104 aligned in a direction extending between electrodes 1 and 2 of the plurality of electrodes 100, thus providing a characterization of the anisotropy of alignment of the 1-D conductive elements 104 in such direction.

Figure 2:
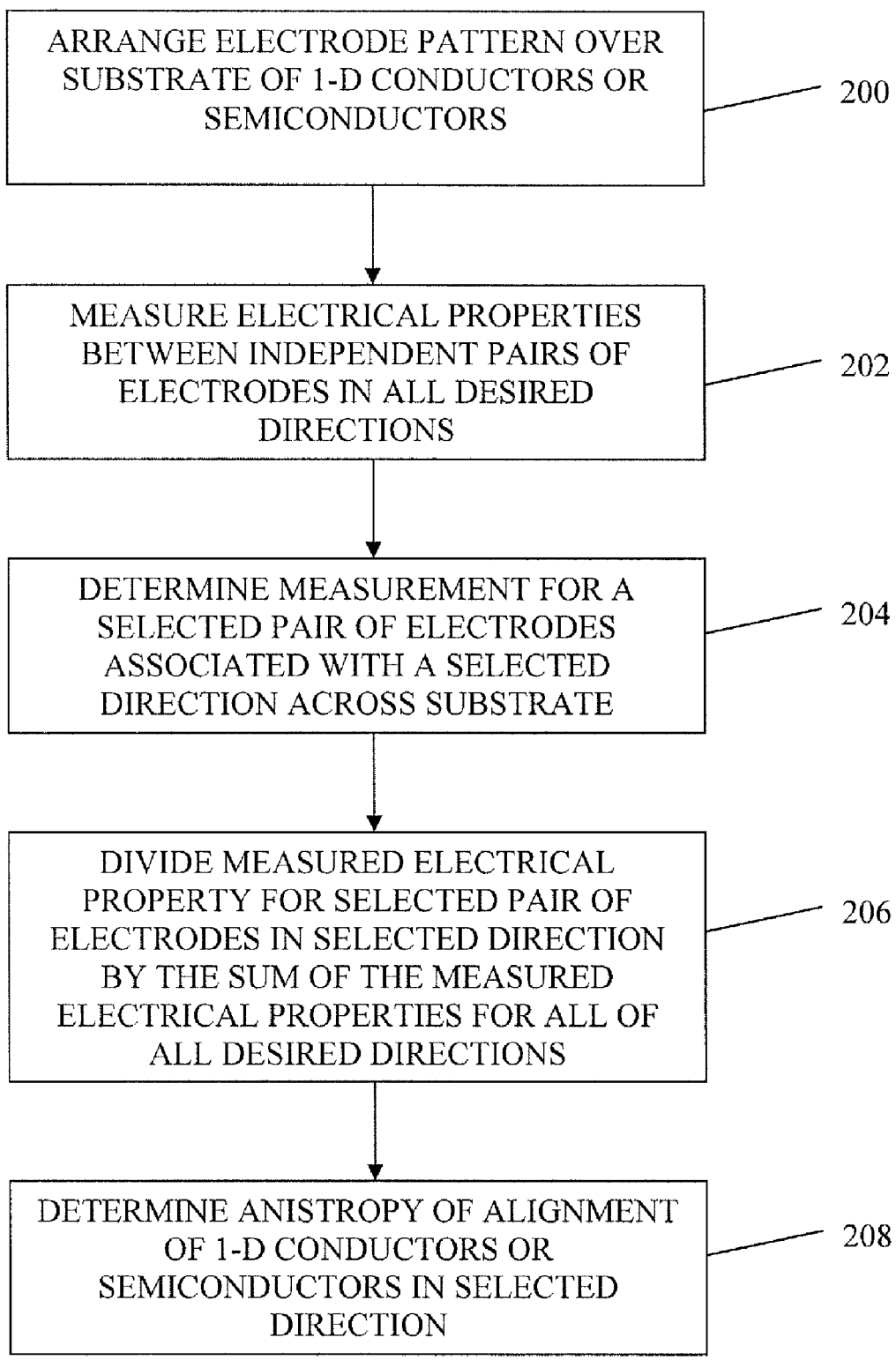
FIG. 2 is an operational flow diagram for characterizing anisotropy of 1-D conductors or semiconductors on a substrate in accordance with one embodiment of the present disclosure.
Figure 4:
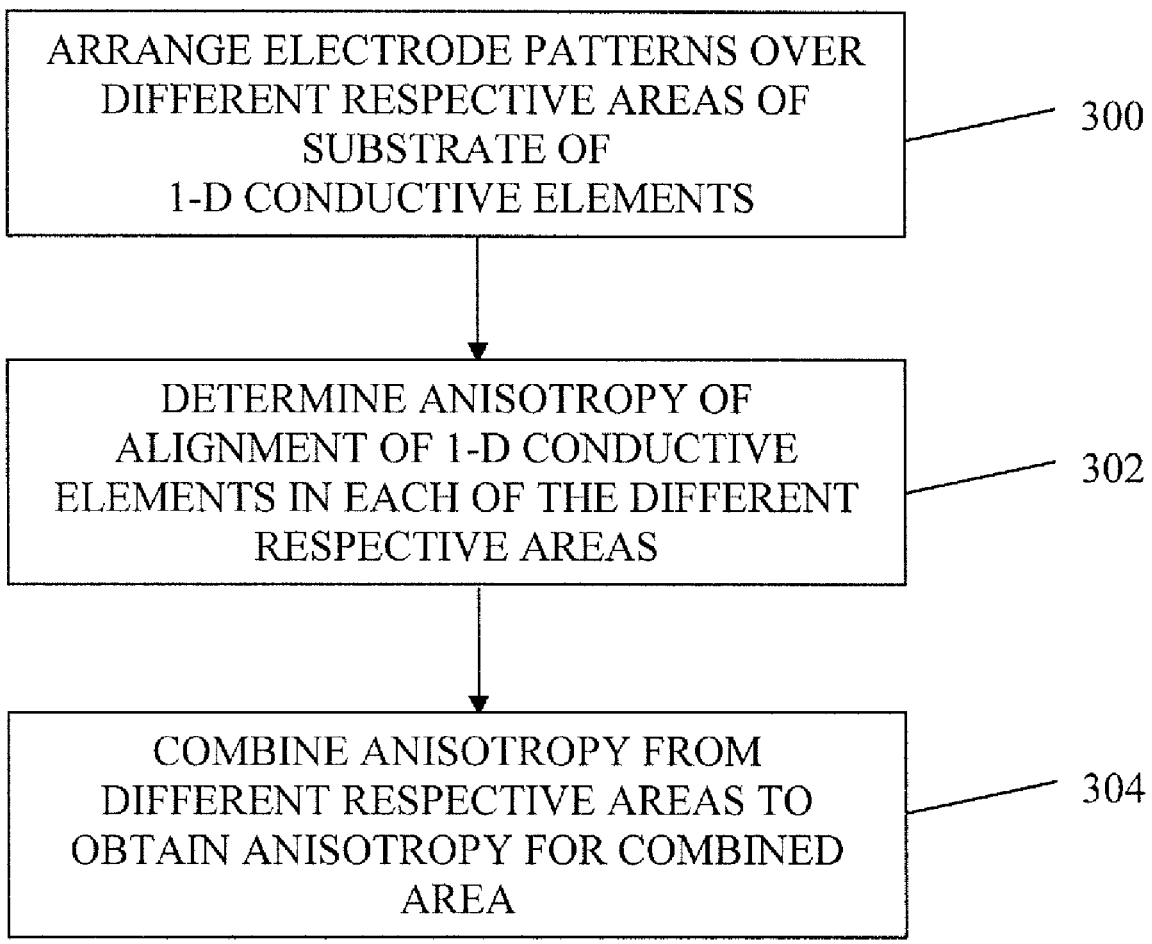
FIG. 4 is an operational flow diagram for performing an entire entity anisotropy characterization in accordance with one embodiment of the present disclosure.

In one or more embodiments, several different patterns of electrodes 100 can be deposited across different respective areas of the substrate 102 in order to obtain the anisotropy of a larger or combined area of interest (e.g., an entire substrate or entire wafer). Referring now to the operational flow diagram of FIG. 4, in accordance with one or more embodiments, different patterns of a plurality of electrodes 100 are positioned on different respective areas area of the substrate 102 in step 300. Each of the measurement steps described herein with respect to FIG. 2 are repeated to obtain a determination of the anisotropy of alignment of the 1-D conductive elements 104 on each of the different areas of the substrate 102 in step 302. The determinations of the anisotropy of alignment of the 1-D conductive elements 104 on different respective areas of the substrate 102 are combined together in step 304 to obtain a combined anisotropy of alignment of the 1-D conductive elements with respect to the combined different respective areas of the substrate 102. The combined anisotropy of alignment can be extended as needed so as to generate a combined map of the "entity anisotropy." Automated test equipment (ATE) connected to electrodes 100 so as to measure the electrical properties of interest can be pre-programmed to accurately acquire these measurements in negligible amount of time. In one or more embodiments, such an entity anisotropy can be used to optimize synthesis parameters to maximize or minimize anisotropy in a given direction. In one or more embodiments, the methods describes in one or more of the embodiments described herein can be implemented for substrates 102 before synthesis of the network of 1-D conductors or semiconductors 104.

In one or more embodiments, the electrodes 100 are connected to larger electrode pads (i.e., "bond pads") that are large enough to be contacted by probe tips of measurement equipment for measuring the electrical parameter. Any electrical property measurement equipment can be attached to the electrodes 100. For example, commercially available measurement equipment can be utilized such as but not limited to the Agilent 4156 parameter analyzer, the Keithley Model 4200 Semiconductor Characterization System, Keithley S680 Parametric Test System, or other similar parametric analyzing measurement equipment. In one or more embodiments, measurements could be implemented in-line (i.e. when the wafer/material/substrate 102 is not yet fully processed) or end-of-line (i.e. after the wafer/material/substrate 102 is fully processed).

As can be seen from the foregoing, the present disclosure describes a technique for accurately and rapidly characterizing the anisotropy of the alignment of 1-D conductors or semiconductors. This technique can be used to help make viable reliable nanotube materials for electronics and other applications by being able to characterize the anisotropy of such materials.

While the system and method have been described in terms of what are presently considered to be specific embodiments, the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A method of characterizing the anisotropy of the alignment of 1-D conductive elements, comprising:

positioning a plurality of electrodes on a substrate containing 1-D conductive elements;

performing a plurality of measurements of an electrical property in a plurality of different desired directions between the plurality of electrodes;

combining the plurality of measurements together to generate a total measurement sum;

determining a measured electrical property between a selected pair of the plurality of electrodes along a selected direction extending between the selected pair of electrodes; and determining an anisotropy of alignment of the 1-D conductive elements on the substrate along the selected direction based on a ratio of the measured electrical property between the selected pair of electrodes versus the total measurement sum.

2. The method of claim 1, wherein the determined anisotropy of alignment of the 1-D conductive elements along the selected direction indicates the direction of alignment of a fraction of all 1-D conductive elements, the fraction of conductive elements being aligned in the selected direction between the selected pair of electrodes.

3. The method of claim 2, further comprising determining the fraction of 1-D conductive elements aligned in the selected direction by dividing the measured electrical property between the selected pair of electrodes by the total measurement sum.

4. The method of claim 1, wherein the plurality of electrodes are electrically isolated from each other.

5. The method of claim 1, further comprising positioning the plurality of electrodes on the substrate by depositing a pre-determined pattern of electrodes on the substrate.

6. The method of claim 5, further comprising measuring the same electrical property between a plurality of respective pairs of electrodes in the pattern of electrodes until measurements are obtained in the plurality of different desired directions, wherein each respective pair of electrodes is associated with one of the desired measurement directions.

7. The method of claim 6, wherein the measured electrical property is current, and anisotropy along a selected direction is determined based on the formula, $$\text{Anisotropy} = \frac{I_{12}}{\sum_{i,j}^{i \neq j} I_{i,j}},$$

wherein $I_{12}$ is a measured current between a selected first electrode and a selected second electrode, wherein $I_{i,j}$ is a measured current between an ith electrode and a jth electrode, and wherein i and j each range between 1 and the number of plurality of electrodes positioned on the substrate.

8. The method of claim 1, further comprising:

positioning a separate plurality of electrodes on a different area of the substrate and repeating each of the measurement steps to obtain a determination of the anisotropy of alignment of the 1-D conductive elements on the different area of the substrate;

combining determinations of the anisotropy of alignment of the 1-D conductive elements on different respective areas of the substrate together to obtain a combined anisotropy of alignment of the 1-D conductive elements with respect to the combined different respective areas of the substrate.

9. The method of claim 1, wherein the 1-D conductive elements include at least one of a 1-D conductor and a 1-D semiconductor.

10. The method of claim 9, wherein the 1-D conductive elements include at least one of a carbon nanotube and a silicon nanowire.

11. A method of characterizing the anisotropy of the alignment of 1-D conductive elements, comprising:
positioning a plurality of electrodes on a substrate containing 1-D conductive elements;
performing a plurality of measurements of an electrical property between respective pairs of electrodes until a separate electrical property measurement is obtained between each electrode and each of the other of the plurality of electrodes;
combining the plurality of measurements together to generate a total measurement sum; and
determining an anisotropy of alignment of the 1-D conductive elements between a selected pair of electrodes based on a ratio of a measured electrical property between the selected pair of electrodes versus the total measurement sum.

12. The method of claim 11, wherein the electrical property is utilized to determine a percentage of 1-D conductive elements aligned in a selected direction between the two electrodes in the selected pair of electrodes with respect to all conductive elements.

13. The method of claim 12, further comprising determining the fraction of 1-D conductive elements aligned in the selected direction by dividing the measured electrical property between the selected pair of electrodes by the total measurement sum.

14. The method of claim 11, wherein the plurality of electrodes are electrically isolated from each other.

15. The method of claim 11, further comprising positioning the plurality of electrodes on the substrate by depositing a pre-determined pattern of electrodes on the substrate.

16. The method of claim 15, further comprising measuring the same electrical property between a plurality of respective pairs of electrodes in the pattern of electrodes until measurements are obtained in a plurality of different desired directions, wherein each respective pair of electrodes is associated with one of the desired measurement directions.

17. The method of claim 16, wherein the measured electrical property is current and anisotropy along a selected direction is determined based on the formula, $$\text{Anisotropy} = \frac{I_{12}}{\sum\limits_{\substack{i,j \\ i \neq j}} I_{i,j}},$$

wherein $I_{12}$ is a measured current between a selected first electrode and a selected second electrode, wherein $I_{i,j}$ is a measured current between an ith electrode and a jth electrode, and wherein i and j each range between 1 and the number of plurality of electrodes positioned on the substrate.

18. The method of claim 11, further comprising:
positioning a separate plurality of electrodes on a different area of the substrate and repeating each of the measurement steps to obtain a determination of the anisotropy of alignment of the 1-D conductive elements on the different area of the substrate;
combining determinations of the anisotropy of alignment of the 1-D conductive elements on different respective areas of the substrate together to obtain a combined anisotropy of alignment of the 1-D conductive elements with respect to the combined different respective areas of the substrate.

19. The method of claim 11, wherein the 1-D conductive elements include at least one of a 1-D conductor and a 1-D semiconductor.

20. The method of claim 19, wherein the 1-D conductive elements include at least one of a carbon nanotube and a silicon nanowire.

* * * * *